United States Patent [19]
Izumikawa

[11] Patent Number: 5,852,385
[45] Date of Patent: Dec. 22, 1998

[54] VOLTAGE CONTROLLED OSCILLATOR CIRCUIT COMPOSED OF OTA-C FILTERS

[75] Inventor: Masanori Izumikawa, Tokyo, Japan

[73] Assignee: NEC Corporation, Tokyo, Japan

[21] Appl. No.: 931,962

[22] Filed: Sep. 17, 1997

[30] Foreign Application Priority Data

Sep. 18, 1996 [JP] Japan ..................................... 8-245377

[51] Int. Cl.⁶ .................................................. H03B 5/24
[52] U.S. Cl. ........................ 331/57; 331/108 B; 331/135; 331/177 R
[58] Field of Search ................................ 331/57, 108 B, 331/135, 177 R

[56] References Cited

U.S. PATENT DOCUMENTS

| | | | |
|---|---|---|---|
| 5,093,634 | 3/1992 | Khoury | 331/108 B |
| 5,564,089 | 10/1996 | Barrett, Jr. | 331/135 |
| 5,635,879 | 6/1997 | Sutardja et al. | 331/57 |

OTHER PUBLICATIONS

Orchard, "Inductorless Filters", Electronics Letters, vol. 2, No. 6, 224–225, Jun. 1996.

Rodriguez–Vazquez et al., On the"Design of Voltage–Controlled Sinusoidal Oscillators Using OTA's", IEEE Transaction on Circuits and Systems, vol. 37, No. 2, 198–210, Feb. 1990.

Khen–Sang Tan et al., "Fully Integrated Analog Filters Using Bipolar–JFET Technology", IEEE Journal of Solid–State Circuits, vol. SC–13, No. 6, 814–821, Dec. 1978.

Primary Examiner—Siegfried H. Grimm
Attorney, Agent, or Firm—Foley & Lardner

[57] ABSTRACT

A voltage controlled oscillator circuit comprises a first lowpass OTA-C filter with differential input and differential output and a second lowpass OTA-C filter with differential input and differential output. A non-inverted output terminal of the first OTA-C filter is connected with a non-inverted input terminal of the second OTA-C filter, an inverted output terminal of the first OTA-C filter is connected with an inverted input terminal of the second OTA-C filter, a non-inverted output terminal of the second OTA-C filter is connected with an inverted input terminal of the first OTA-C filter, and an inverted output terminal of the second OTA-C filter is connected with a non-inverted input terminal of the first OTA-C filter. Gate widths of input terminals of OTAs in each OTA-C filter are set appropriately, and initial values of terminals are set by nMOSFETs 3–6, and oscillation output is outputted from the non-inverted output terminal and the inverted output terminal of the second OTA-C filter. According to the voltage controlled oscillator circuit, oscillation of a waveform of a sine wave can be obtained, switching noise can be reduced, and common mode noise can be removed by differential operation. Further, susceptibility to outside noise from power sources, circuit boards, etc. can be reduced, since sensitivity is reduced by utilizing OTA-C filters derived from doubly resistively terminated LC filters. And consequently, oscillation output including little phase noise is obtained.

15 Claims, 10 Drawing Sheets

F I G. 11
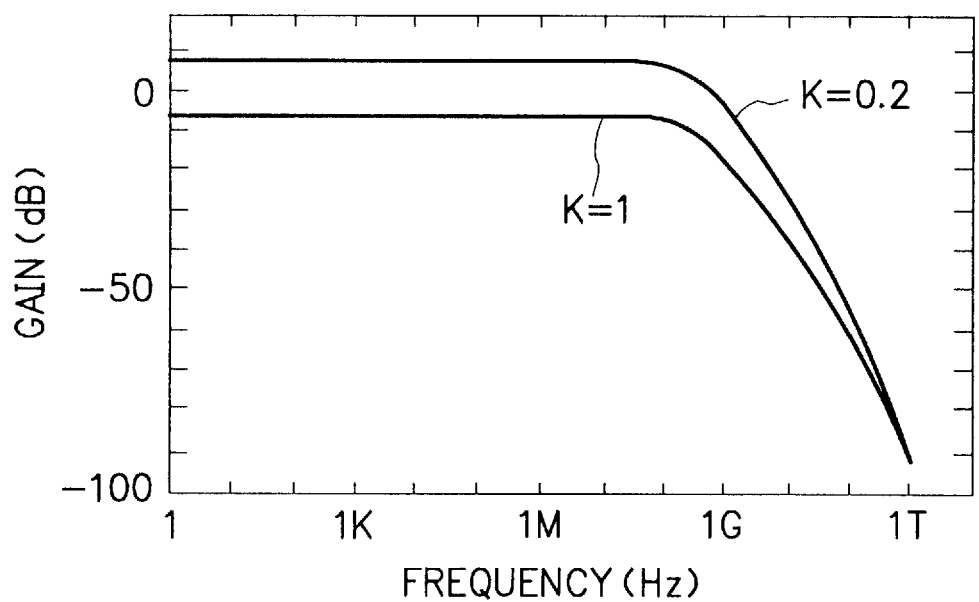

F I G. 12
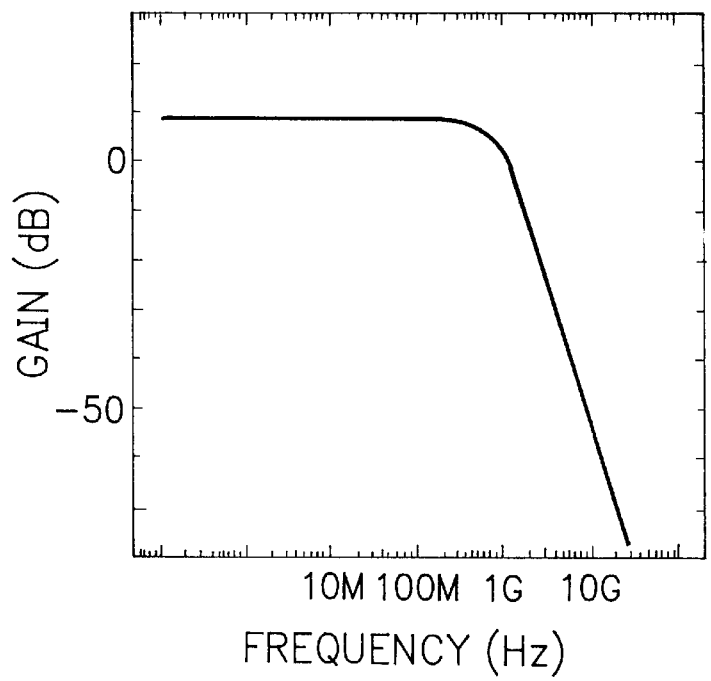
F I G. 13
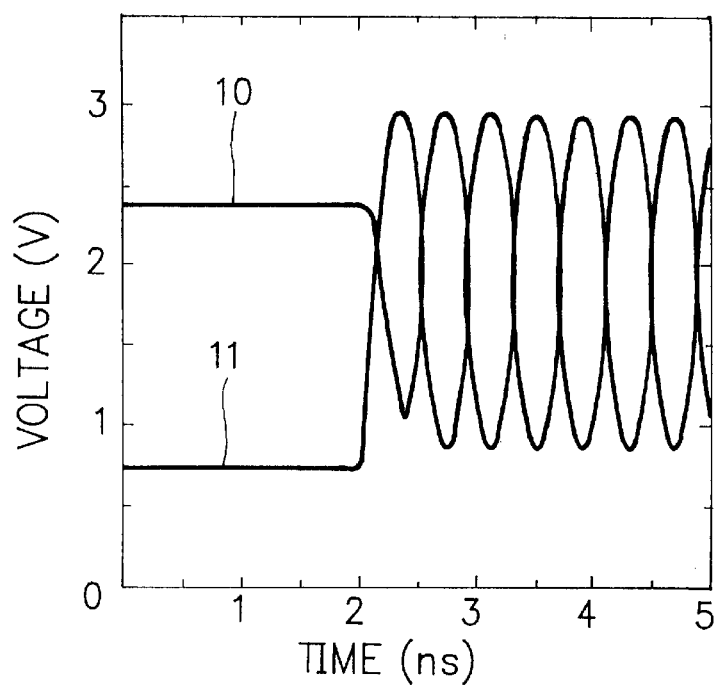

5,852,385

VOLTAGE CONTROLLED OSCILLATOR CIRCUIT COMPOSED OF OTA-C FILTERS

BACKGROUND OF THE INVENTION

The present invention relates to a voltage controlled oscillator circuit, and in particular, to a voltage controlled oscillator circuit utilizing CMOS (Complementary Metal Oxide Semiconductor).

Description of the Prior Art

Generally, voltage controlled oscillator circuits are utilized for phase-locked loops or for the purpose of clock recovery. One of the most critical and important characteristics for evaluating the voltage controlled oscillator circuit is a phase noise. The phase noise is a noise which occurs in a phase of a periodic or cyclic signal.

For example, when a sine wave is represented as $\sin(\omega t + \theta)$, the phase $\theta$ is ideally a constant. However, the phase $\theta$ actually varies dependent on time. The time-dependent variation of the phase of a periodic signal is the phase noise. The phase noise of a device is caused by noise from outside transmitted via power sources or circuit boards, noise occurred in switchings by transistors, noise of the device itself such as thermal noise, etc.

As CMOS voltage controlled oscillator circuits, there exist circuits using a ring oscillator and circuits using inductors. The ring oscillator is composed of a chain of inverters and involves a large amount of phase noise due to switching noise of the inverters. The phase noise of the oscillator circuit using inductors is low. However, integration of a lot of inductors having high Q-values is impossible.

Incidentally, an oscillator can be realized by coupling two integrators. This kind of oscillator has oscillation output of a shape of a sine wave, and thus have reduced switching noise. A sine wave oscillator using OTAs (Operational Transconductance Amplifiers) and capacitors is disclosed in a document: IEEE Transactions on Circuits and Systems, vol.37, No.2, February 1990, pages 198–210, A.Vazquez et al. "On the Design of Voltage-Controlled Sinusoidal Oscillators Using OTA's" (hereafter, referred to as 'document No.1').

A filter can also be realized by using an OTAs and capacitors, as disclosed in a document: IEEE Journal of Solid-State Circuits, vol.SC-13, No.6, December 1978, pages 814–821, K.Tan, P.Gray "Fully Integrated Analog Filters Using Bipolar-JFET Technology" (hereafter, referred to as 'document No.2').

According to the document No.2, a doubly resistively terminated LC filter shown in FIG. 1 can be replaced by an equivalent circuit shown in FIG. 2. In FIG. 1, a third order LC filter is composed of a capacitor C1, a capacitor C3, and an inductor L2. in which a resistor RS and a resistor RL are provided to the input side and the output side of the filter respectively. The filter circuit shown in FIG. 2 which is equivalent to the doubly resistively terminated third order LC filter shown in FIG. 1 is composed of integrators 91, 92 and 93, as described in the document No.2. Each of the integrators is comprised of an operational amplifier 90, capacitors C, and resistors R as shown in FIG. 3.

FIG. 4 is a circuit diagram showing a doubly resistively terminated second order LC filter, and FIG. 5 is a second order filter circuit which is equivalent to the doubly resistively terminated second order LC filter shown in FIG. 4.

In FIG. 4, the second order LC filter is composed of a capacitor C and an inductor L, in which a resistor $R_1$ and a resistor $R_2$ are provided to the input side and the output side of the filter respectively. The equivalent filter circuit shown in FIG. 5 is comprised of two OTAs and two capacitors. In the filter of FIG. 4, current $I_L$ (current passing through the inductor L) and output voltage $V_o$ of the filter are expressed as following equations (1) and (2).

$$I_L = (V_1 - V_o - R_1 I_L)/s\,L \qquad (1)$$

$$V_o = (I_L - V_o/R_2)/s\,C \qquad (2)$$

Here, $V_1$ is input voltage of the filter and s is frequency in complex number.

The transfer function of the filter is expressed by following equation (3).

$$H(s) = 1/\{L\,C\,s^2 + (R_1 C + L/R_2)\,s + (1 + R_1/R_2)\} \qquad (3)$$

FIG. 6 is a graph showing a gain characteristic of the doubly resistively terminated second order LC filter of FIG. 4 in the case where L=1nH, C=1pF, $R_1 = R_2 = 1k\,\Omega$ (general values). As shown in FIG. 6, the gain by the resistively terminated filter circuit is negative, and positive gain can not be obtained. Therefore, such resistively terminated filter circuits have not been utilized for oscillators.

Incidentally, such kind of filters as shown in FIG. 5 are called 'OTA-C filters', and low sensitivity of these filters which are derived from doubly resistively terminated LC filters is referred to in 'Inductorless Filters' (H. J. Orchard), pp224–225 of Electronics Letters, Jun. 1966.

As described above, among conventional voltage controlled oscillator circuits, the ring oscillator composed of inverters has a drawback of large phase noise due to its own switching noise. The conventional oscillator using OTAs and capacitors described in the document No.1 has a drawback of being susceptible to outside noise from power sources, circuit boards, etc., and thus involves large phase noise. Further, the conventional oscillator described in the document No.1 is susceptible to noise originally contained in inputted signals, since its input terminal is single-ended.

Furthermore, filters comprising OTAs and capacitors as described in the document No.2, which are derived from resistively terminated filter circuits can not be utilized as oscillators since their gains are generally negative.

SUMMARY OF THE INVENTION

It is therefore the primary object of the present invention to provide a voltage controlled oscillator circuit which involves little phase noise.

In accordance with the present invention, there is provided a voltage controlled oscillator circuit comprising N (N: 2,3, ... ) sets of OTA-C (Operational Transconductance Amplifier-Capacitor) filters. Each OTA-C filter includes a non-inverted input terminal, an inverted input terminal complementary to the non-inverted input terminal, a non-inverted output terminal, and an inverted output terminal complementary to the non-inverted output terminal. And in each OTA (Operational Transconductance Amplifier) in the OTA-C filters, gate widths of 'reversed input terminals' are set narrower than gate widths of 'unreversed input terminals'. Here, a 'reversed input terminal' of an OTA means an input terminal to which a signal outputted from the OTA itself or a signal outputted from another OTA is inputted 'reversed'. For each M (M: 1, ... N–1), the non-inverted output terminal of the M-th OTA-C filter is connected with the non-inverted input terminal of the (M+1)-th OTA-C filter, the inverted output terminal of the M-th OTA-C filter is connected with the inverted input terminal of the (M+1)-th OTA-C filter, the non-inverted output terminal of the N-th OTA-C filter is connected with the inverted input terminal of the first OTA-C filter, the inverted output terminal of the N-th OTA-C filter is connected with the non-inverted input terminal of the first OTA-C filter, and oscillation output of the voltage controlled oscillator circuit is outputted from the non-inverted output terminal and the inverted output terminal of the N-th OTA-C filter.

Preferably, the OTA-C filter has composition equivalent to a doubly resistively terminated LC filter circuit.

Preferably, the OTA-C filter includes OTAs and capacitors having capacitance according to the cutoff frequency of the OTA-C filter.

Preferably, the voltage controlled oscillator circuit further comprises a level setting means for setting the non-inverted output terminals of the N sets of OTA-C filters in a first voltage level and setting the inverted output terminals of the N sets of OTA-C filters in a second voltage level which is logical inversion of the first voltage level.

Preferably, the level setting means includes N sets of nMOSFETs each of which is supplied with an external signal to its gate and source and supplied with a non-inverted output of corresponding one of the N sets of OTA-C filters to its drain, and N sets of nMOSFETs each of which is supplied with the external signal to its gate and supplied with the ground level to its source and supplied with an inverted output of corresponding one of the N sets of OTA-C filters to its drain, in which the external signal is set so as to set the non-inverted output terminals of the N sets of OTA-C filters in the first voltage level and so as to set the inverted output terminals of the N sets of OTA-C filters in the second voltage level which is logical inversion of the first voltage level.

Instead, the level setting means may as well include N sets of nMOSFETs each of which is supplied with an external signal to its gate and supplied with the ground level to its source and supplied with an inverted output of corresponding one of the N sets of OTA-C filters to its drain, and N sets of pMOSFETs each of which is supplied with an external signal bar which is complementary to the external signal to its gate and supplied with the power source voltage to its source and supplied with a non-inverted output of corresponding one of the N sets of OTA-C filters to its drain, in which the external signal is set so as to set the non-inverted output terminals of the N sets of OTA-C filters in the first voltage level and so as to set the inverted output terminals of the N sets of OTA-C filters in the second voltage level which is logical inversion of the first voltage level.

Preferably, each of the N sets of OTA-C filters includes a first OTA circuit, a second OTA circuit, a first capacitor, and a second capacitor. The first OTA circuit has a first input terminal, a first input terminal bar which is complementary to the first input terminal, a second input terminal, a second input terminal bar which is complementary to the second input terminal, a third input terminal, a third input terminal bar which is complementary to the third input terminal, a first output terminal, and a first output terminal bar which is complementary to the first output terminal. The second OTA circuit has a fourth input terminal, a fourth input terminal bar which is complementary to the fourth input terminal, a fifth input terminal, a fifth input terminal bar which is complementary to the fifth input terminal, a second output terminal, and a second output terminal bar which is complementary to the second output terminal. The first capacitor is connected between the first output terminal and the ground. The second capacitor is connected between the first output terminal bar and the ground. The third capacitor is connected between the second output terminal and the ground. The fourth capacitor is connected between the second output terminal bar and the ground. The first input terminal is connected with the first output terminal bar and the first input terminal bar is connected with the first output terminal. The second input terminal is connected with the non-inverted input terminal of the OTA-C filter and the second input terminal bar is connected with the inverted input terminal of the OTA-C filter. The third input terminal is connected with the second output terminal bar and the third input terminal bar is connected with the second output terminal. The fourth input terminal is connected with the first output terminal and the fourth input terminal bar is connected with the first output terminal bar. The fifth input terminal is connected with the second output terminal bar and the fifth input terminal bar is connected with the second output terminal. And the second output terminal is connected with the non-inverted output terminal of the OTA-C filter and the second output terminal bar is connected with the inverted output terminal of the OTA-C filter.

Or, each of the N sets of OTA-C filters preferably includes a first OTA circuit, a second OTA circuit, a third OTA circuit, a first capacitor, a second capacitor, a third capacitor, a fourth capacitor, a fifth capacitor, and a sixth capacitor. The first OTA circuit has a first input terminal, a first input terminal bar which is complementary to the first input terminal, a second input terminal, a second input terminal bar which is complementary to the second input terminal, a third input terminal, a third input terminal bar which is complementary to the third input terminal, a first output terminal, and a first output terminal bar which is complementary to the first output terminal. The second OTA circuit has a fourth input terminal, a fourth input terminal bar which is complementary to the fourth input terminal, a fifth input terminal, a fifth input terminal bar which is complementary to the fifth input terminal, a second output terminal, and a second output terminal bar which is complementary to the second output terminal. The third OTA circuit has a sixth input terminal, a sixth input terminal bar which is complementary to the sixth input terminal, a seventh input terminal, a seventh input terminal bar which is complementary to the seventh input terminal, a third output terminal, and a third output terminal bar which is complementary to the third output terminal. The first capacitor is connected between the first output terminal and the ground. The second capacitor is connected between the first output terminal bar and the ground. The third capacitor is connected between the second output terminal and the ground. The fourth capacitor is connected between the second output terminal bar and the ground. The fifth capacitor is connected between the third output terminal and the ground. The sixth capacitor s connected between the third output terminal bar and the ground. The first input terminal is connected with the first output terminal bar and the first input terminal bar is connected with the first output terminal. The second input terminal is connected with the non-inverted input terminal of the OTA-C filter and the second input terminal bar is connected with the inverted input terminal of the OTA-C filter. The third input terminal is connected with the second output terminal bar and the third input terminal bar is connected with the second output terminal. The fourth input terminal is connected with the first output terminal and the fourth input terminal bar is connected with the first output terminal bar. The fifth input terminal is connected with the third output terminal bar and the fifth input terminal bar is connected with the third output terminal. The sixth input terminal is connected with the second output terminal and the sixth input terminal bar is connected with the second output terminal bar. The seventh input terminal is connected with the third output terminal bar and the seventh input terminal bar is connected with the third output terminal. And the third output terminal is connected with the non-inverted output terminal of the OTA-C filter and the third output terminal bar is connected with the inverted output terminal of the OTA-C filter.

Preferably, each OTA circuit includes a first pMOSFET whose gate is supplied with a first control signal and whose source is supplied with the power source voltage, a second pMOSFET whose gate is supplied with the first control signal and whose source is supplied with the power source voltage, a first nMOSFET whose gate is supplied with a second control signal and whose source is connected to the ground, a second nMOSFET whose gate is supplied with the power source voltage and whose source is connected to the ground and whose drain is connected with the drain of the first nMOSFET, a third nMOSFET whose gate is supplied with a first input signal and whose source is connected with the drain of the first nMOSPET and whose drain is connected with the drain of the first pMOSFET, a fourth nMOSFET whose gate is supplied with a first input signal bar which is complementary to the first input signal and whose source is connected with the drain of the first nMOSFET and whose drain is connected with the drain of the second pMOSFET, a fifth nMOSFET whose gate is supplied with a second input signal and whose source is connected with the drain of the first nMOSFET and whose drain is connected with the drain of the first pMOSFET, and a sixth nMOSFET whose gate is supplied with a second input signal bar which is complementary to the second input signal and whose source is connected with the drain of the first nMOS-FET and whose drain is connected with the drain of the second pMOSFET.

Preferably, the voltage controlled oscillator circuit further comprises a seventh nMOSFET whose gate is supplied with the second control signal and whose source is connected to the ground, an eighth nMOSFET whose gate is supplied with the power source voltage and whose source is connected to the ground and whose drain is connected with the drain of the seventh nMOSFET, and a third pMOSFET whose gate and drain is connected with the drain of the seventh nMOSFET and whose source is supplied with the power source voltage. The voltage level of the gate of the third pMOSFET is used as the first control signal.

Preferably, each OTA circuit includes a first pMOSFET whose gate is supplied with a first control signal and whose source is supplied with the power source voltage, a second pMOSFET whose gate is supplied with the first control signal and whose source is supplied with the power source voltage, a first nMOSFET whose gate is supplied with a second control signal and whose source is connected to the ground, a second nMOSFET whose gate is supplied with a second control signal and whose source is connected to the ground, a third nMOSFET whose gate is supplied with a first input signal and whose source is connected with the drain of the first nMOSFET and whose drain is connected with the drain of the first pMOSFET, a fourth nMOSFET whose gate is supplied with a first input signal bar which is complementary to the first input signal and whose source is connected with the drain of the first nMOSFET and whose drain is connected with the drain of the second pMOSFET, a fifth nMOSFET whose gate is supplied with a second input signal and whose source is connected with the drain of the second nMOSFET and whose drain is connected with the drain of the first pMOSFET, and a sixth nMOSFET whose gate is supplied with a second input signal bar which is complementary to the second input signal and whose source is connected with the drain of the second nMOSFET and whose drain is connected with the drain of the second pMOSFET.

In accordance with another aspect of the present invention, a voltage controlled oscillator circuit comprises a first OTA-C filter and a second OTA-C filter. Each OTA-C filter includes a non-inverted input terminal, an inverted input terminal complementary to the non-inverted input terminal, a non-inverted output terminal, and an inverted output terminal complementary to the non-inverted output terminal. In each OTA in the OTA-C filters, gate widths of 'reversed input terminals' are set narrower than gate widths of 'unreversed input terminals'. Here, a 'reversed input terminal' of an OTA means an input terminal to which a signal outputted from the OTA itself or a signal outputted from another OTA is inputted 'reversed'. The non-inverted output terminal of the first OTA-C filter is connected with the non-inverted input terminal of the second OTA-C filter. The inverted output terminal of the first OTA-C filter is connected with the inverted input terminal of the second OTA-C filter. The non-inverted output terminal of the second OTA-C filter is connected with the inverted input terminal of the first OTA-C filter. The inverted output terminal of the second OTA-C filter is connected with the non-inverted input terminal of the first OTA-C filter. And oscillation output of the voltage controlled oscillator circuit is outputted from the non-inverted output terminal and the inverted output terminal of the second OTA-C filter.

Preferably, the voltage controlled oscillator circuit further comprises a level setting means for setting the non-inverted output terminals of the first and the second OTA-C filters in a first voltage level and setting the inverted output terminals of the first and the second OTA-C filters in a second voltage level which is logical inversion of the first voltage level.

Preferably, the level setting means includes a first nMOSFET which is supplied with an external signal to its gate and source and supplied with the non-inverted output of the first OTA-C filter to its drain, a second nMOSFET which is supplied with the external signal to its gate and source and supplied with the non-inverted output of the second OTA-C filter to its drain, a third nMOSFET which is supplied with the external signal to its gate and supplied with the ground level to its source and supplied with the inverted output of the first OTA-C filter to its drain, a fourth nMOSFET which is supplied with the external signal to its gate and supplied with the ground level to its source and supplied with the inverted output of the second OTA-C filter to its drain, in which the external signal is set so as to set the non-inverted output terminals of the first and the second OTA-C filters in the first voltage level and so as to set the inverted output terminals of the first and the second OTA-C filters in the second voltage level which is logical inversion of the first voltage level.

Preferably, each of the first and the second OTA-C filter includes OTAs and capacitors having capacitance according to the cutoff frequency of the OTA-C filter.

BRIEF DESCRIPTION OF THE DRAWINGS

The objects and features of the present invention will become more apparent from the consideration of the following detailed description taken in conjunction with the accompanying drawings, in which:

FIG. 11 is a graph showing frequency characteristics of doubly resistively terminated second order LC filters with various parameters.

FIG. 12 is a graph showing a gain characteristic of an OTA-C filter shown in FIG. 8 and FIG. 9;

FIG. 13 is a graph showing output waveform of the voltage controlled oscillator circuit shown in FIG. 7;

DESCRIPTION OF THE PREFERRED EMBODIMENTS

Figure 1:
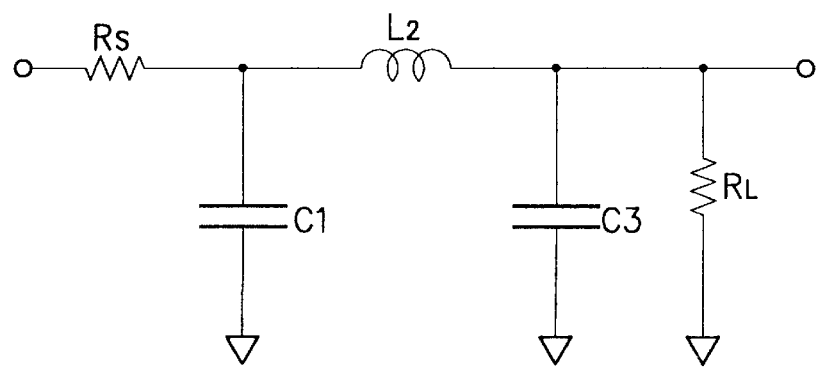
FIG. 1 is a circuit diagram showing composition of a general doubly resistively terminated third order LC filter.
Figure 2:
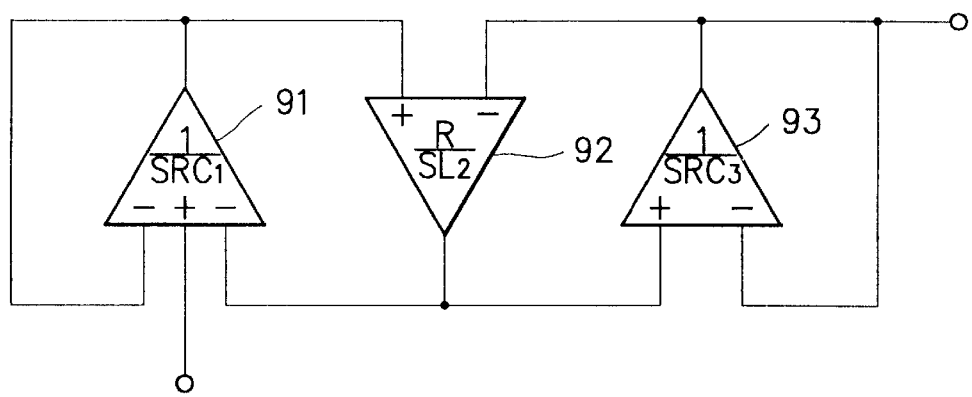
FIG. 2 is a circuit diagram showing a circuit equivalent to FIG. 1.
Figure 3:
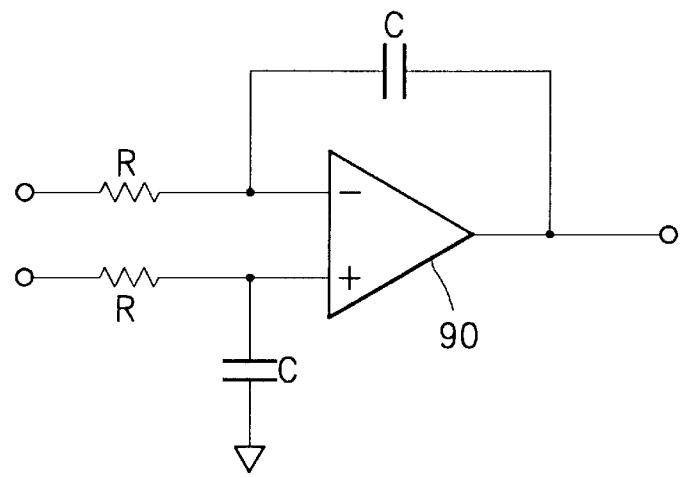
FIG. 3 is a circuit diagram showing composition of an integrator in FIG. 2.
Figure 4:
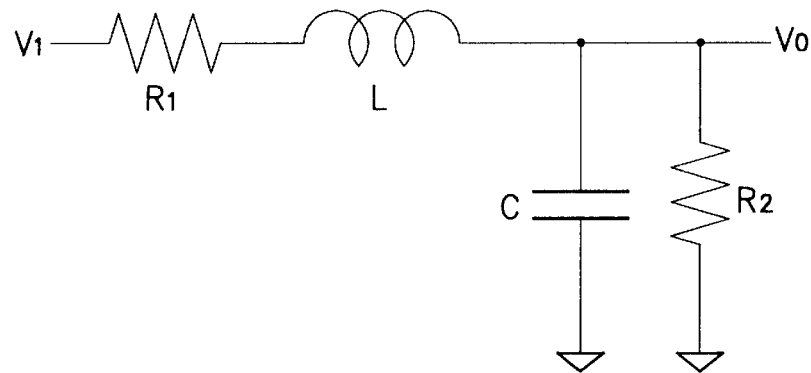
FIG. 4 is a circuit diagram showing composition of a general doubly resistively terminated second order LC filter.
Figure 5:
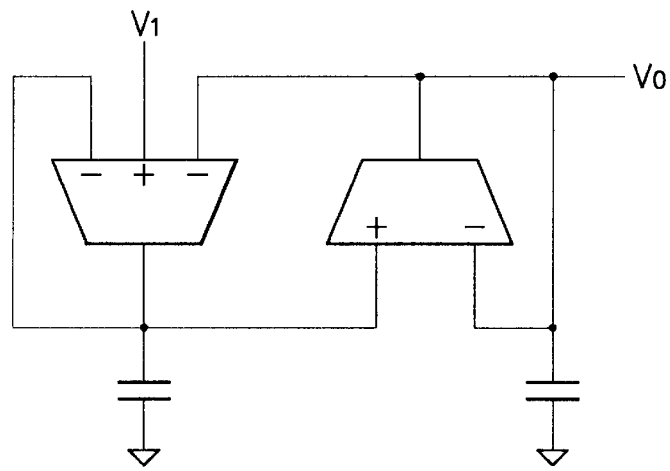
FIG. 5 is a circuit diagram showing a circuit equivalent to FIG. 4.
Figure 6:
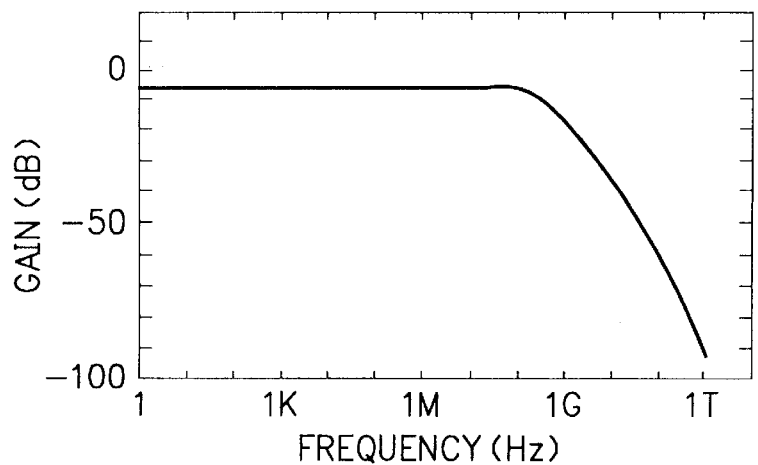
FIG. 6 is a graph showing a gain characteristic of the doubly resistively terminated second order LC filter of FIG. 4.

Referring now to the drawings, a description will be given in detail of preferred embodiments in accordance with the present invention.

Figure 7:
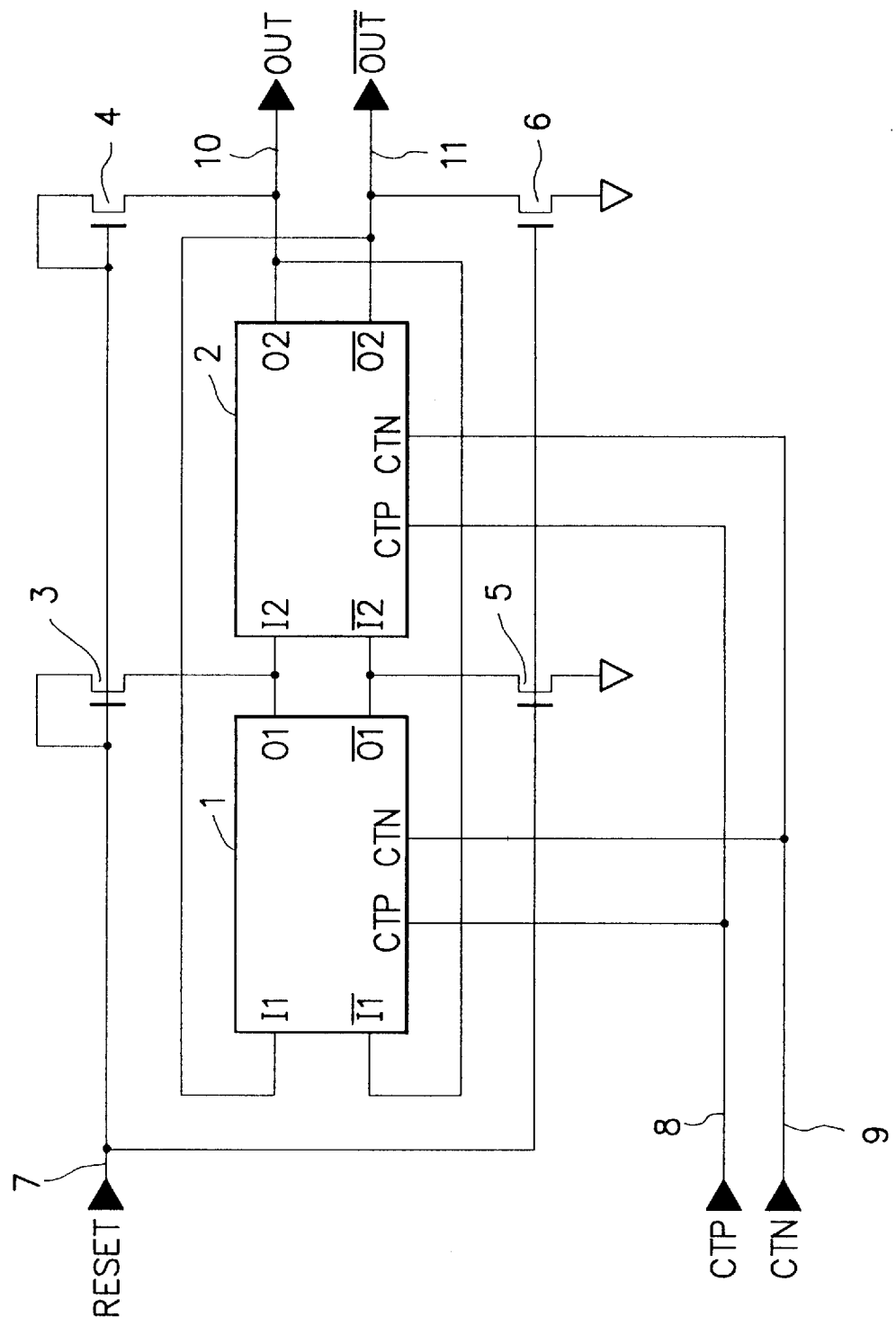
FIG. 7 is a circuit diagram showing a voltage controlled oscillator circuit according to an embodiment of the present invention.

FIG. 7 is a block diagram showing a voltage controlled oscillator circuit according to an embodiment of the present invention. The voltage controlled oscillator circuit comprises a lowpass OTA-C filter 1 and a lowpass OTA-C filter 2. An input terminal I1, an input terminal I1 which is complementary to the input terminal I1, an output terminal O1, and an output terminal O1 which is complementary to the output terminal O1 are provided to the lowpass OTA-C filter 1. And an input terminal I2, an input terminal I2 which is complementary to the input terminal I2, an output terminal O2, and an output terminal O2 which is complementary to the output terminal O2 are provided to the lowpass OTA-C filter 2. The output terminal O1 and the input terminal I2, the output terminal O1 and the input terminal I2, the output terminal O2 and the input terminal I1, the output terminal O2 and the input terminal I1 are connected together, respectively. These OTA-C filters 1 and 2 are filters which are derived from doubly resistively terminated LC filter circuits such as filter circuits shown in FIG. 1 ,FIG. 2, FIG. 4, or FIG. 5.

Incidentally, although cases where the OTA-C filters 1 and 2 are second order filters or third order filters will be described in the following, the OTA-C filters 1 and 2 may as well be fourth order, fifth order, etc. And although the number of OTA-C filters shown in FIG. 7 is two, the number of OTA-C filters used in the voltage controlled oscillator circuit according to the present invention is not limited to two, and the number may as well be three, four, five, etc.

The voltage controlled oscillator circuit of FIG. 7 further comprises N-channel MOSFETs(hereafter, referred to as nMOSFETs)3–6 for setting initial values as shown in FIG. 7. In other words, the voltage controlled oscillator circuit includes a nMOSFET3 whose gate and source are supplied with the RESET signal 7 and whose drain is connected to the output terminal O1 of the OTA-C filter 1, a nMOSFET4 whose gate and source are supplied with the RESET signal 7 and whose drain is connected to the output terminal O2 of the OTA-C filter 2, a nMOSFET5 whose gate is supplied with the RESET signal 7 and whose source is grounded and whose drain is connected to the output terminal O1 of the OTA-C filter 1, and a nMOSPET6 whose gate is supplied with the RESET signal 7 and whose source is grounded and whose drain is connected to the output terminal O2 of the OTA-C filter 2.

Incidentally, the CTN signal 9 in FIG. 7 is a gate voltage control signal for nMOSFETs inside the OTA-C filters 1 and 2, and the CTP signal 8 in FIG. 7 is a gate voltage control signal for P-channel MOSFETs(hereafter, referred to as pMOSFETs) inside the OTA-C filters 1 and 2.

The terminal CTN and the terminal CTP in FIG. 7 serve as control input terminals of the voltage controlled oscillator circuit of this embodiment. And in this oscillator circuit, the oscillation output signals OUT 10 and OUT 11 are outputted from the output terminals O2 and O2 of the OTA-C filter 2, respectively.

In the following, the operation of the voltage controlled oscillator circuit of FIG. 7 will be described. First, the RESET signal 7 is set in High level. By this operation, the output terminal O1 of the OTA-C filter 1 and the output terminal O2 of the OTA-C filter 2 are set in High level, and the output terminal O1 of the OTA-C filter 1 and the output terminal O2 of the OTA-C filter 2 are set in Low level. Here, the above High level is a voltage level lower than the power source voltage level by the threshold voltage of the nMOSFETs 3 and 4.

Subsequently, the RESET signal 7 is switched to Low level. By this operation, since levels of output terminals of the OTA-C filter 1 follow levels of corresponding input terminals of the OTA-C filter 1 when the RESET signal 7 is in Low level, and since the input terminals I1 and I1 of the OTA-C filter 1 are in Low level and High level respectively, the output terminal O1 of the OTA-C filter 1 changes from High level to Low level and the output terminal O1 of the OTA-C filter 1 changes from Low level to High level (operation No.1).

Subsequently, since the input terminal I2 of the OTA-C filter 2 changed from High level to Low level and the input terminal I2 of the OTA-C filter 2 changed from Low level to High level, the output terminal O2 of the OTA-C filter 2 changes from High level to Low level and the output terminal O2 of the OTA-C filter 2 changes from Low level to High level (operation No.2).

Subsequently, since the input terminals I1 and I1 of the OTA-C filter 1 became High level and Low level respectively, the output terminal O1 of the OTA-C filter 1 changes from Low level to High level and the output terminal O1 of the OTA-C filter 1 changes from High level to Low level (operation No.3).

Subsequently, since the input terminal I2 of the OTA-C filter 2 changed from Low level to High level and the input terminal I2 of the OTA-C filter 2 changed from High level to Low level, the output terminal O2 of the OTA-C filter 2 changes from Low level to High level and the output terminal O2 of the OTA-C filter 2 changes from High level to Low level (operation No.4).

After this, the voltage controlled oscillator circuit of FIG. 7 continues oscillating, repeating the sequence of the operation No.1 through the operation No.4. Incidentally, gains of the OTA-C filters 1 and 2 are made positive as described below.

Figure 8:
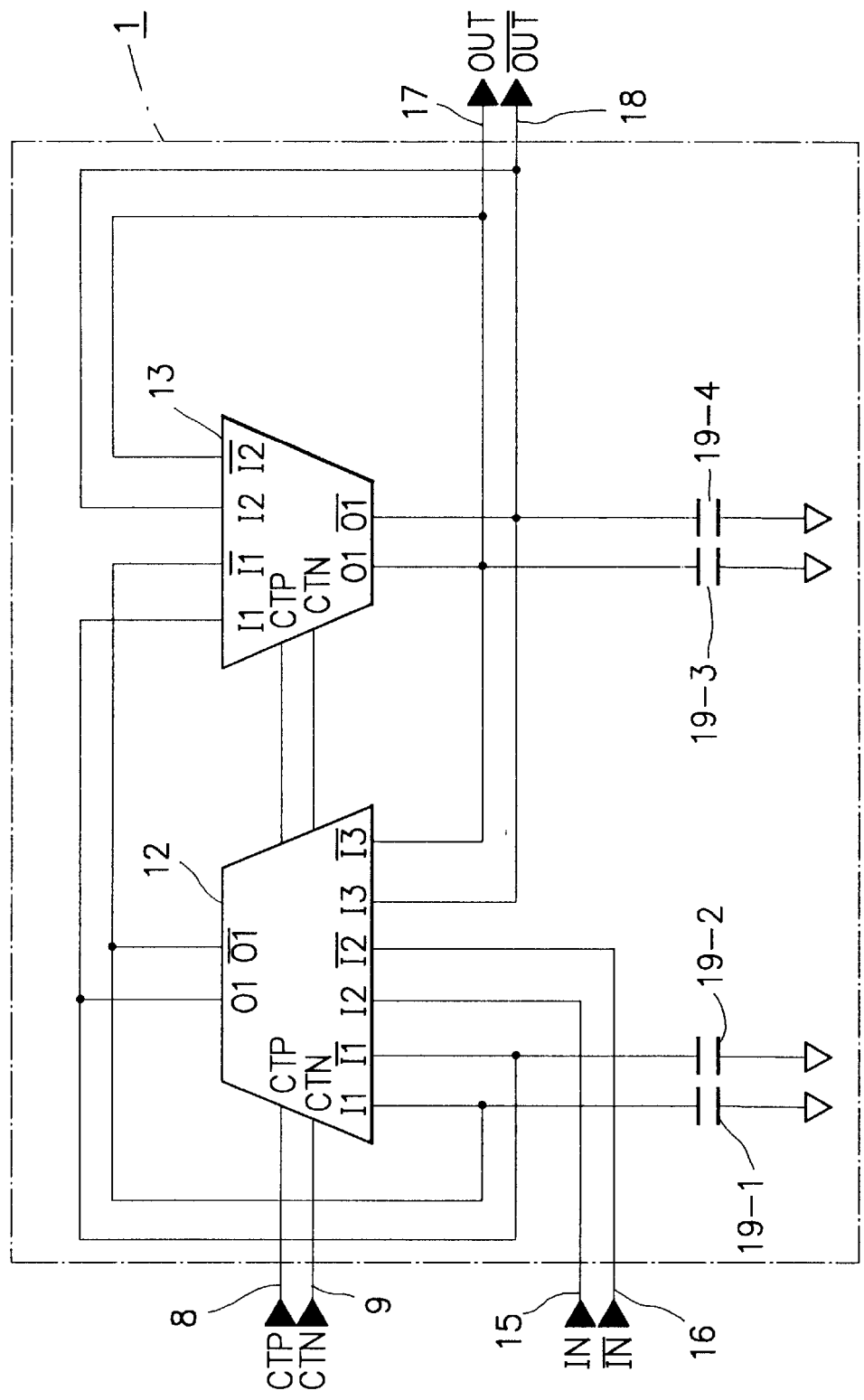
FIG. 8 is a circuit diagram showing composition of a lowpass OTA-C filter with differential input and differential output in FIG. 7.

In the following, an example of internal composition of the OTA-C filter 1 in FIG. 7 will be described. FIG. 8 is a circuit diagram showing composition of a lowpass OTA-C filter with differential input and differential output, which is derived from doubly resistively terminated LC filter circuit. In FIG. 8, the same reference characters as those of FIG. 7 designate equivalent components. Incidentally, the OTA-C filter 2 in FIG. 7 also has equivalent composition.

In FIG. 8, the lowpass OTA-C filter 1 includes an OTA 12 which receives three pairs of differential input signals and outputs a pair of differential output signals, OTA 13 which receives two pairs of differential input signals and outputs a pair of differential output signals, and four capacitors 19-1 through 19-4 having capacitance corresponding to the cutoff frequency of the filter 1. In other words, the OTA 12 has six input terminals, i.e. an input terminal I1, an input terminal I1 which is complementary to the input terminal I1, an input terminal I2, an input terminal I2 which is complementary to the input terminal I2, an input terminal I3, and an input terminal I3 which is complementary to the input terminal I3, and the OTA 12 has two output terminals, i.e. an output terminal O1 and an output terminal O1 which is complementary to the output terminal O1. The OTA 13 has four input terminals, i.e. an input terminal I1, an input terminal I1 which is complementary to the input terminal I1, an input terminal I2, and an input terminal I2 which is complementary to the input terminal I2, and the OTA 13 has two output terminals, i.e. an output terminal O1 and an output terminal O1 which is complementary to the output terminal O1.

The capacitor 19-1 is connected between the output terminal O1 of the OTA 12 and the ground, the capacitor 19-2 is connected between the output terminal O1 of the OTA 12 and the ground, the capacitor 19-3 is connected between the output terminal O1 of the OTA 13 and the ground, and the capacitor 19-4 is connected between the output terminal O1 of the OTA 13 and the ground.

The filter 1 receives an input signal IN 15 and an input signal IN 16, and outputs an output signal OUT 17 and an output signal OUT 18. The input signal IN 15 is inputted into the input terminal I2 of the OTA 12, and the input signal IN 16 is inputted into the input terminal I2 of the OTA 12. And the output signal OUT 17 is outputted from the output terminal O1 of the OTA 13, and the output signal OUT 18 is outputted from the output terminal O1 of the OTA 13. A gate voltage control signal CTN 9 for internal nMOSFETs and a gate voltage control signal CTP 8 for internal pMOSFETs are supplied to each of the OTAs 12 and 13.

Figure 9:
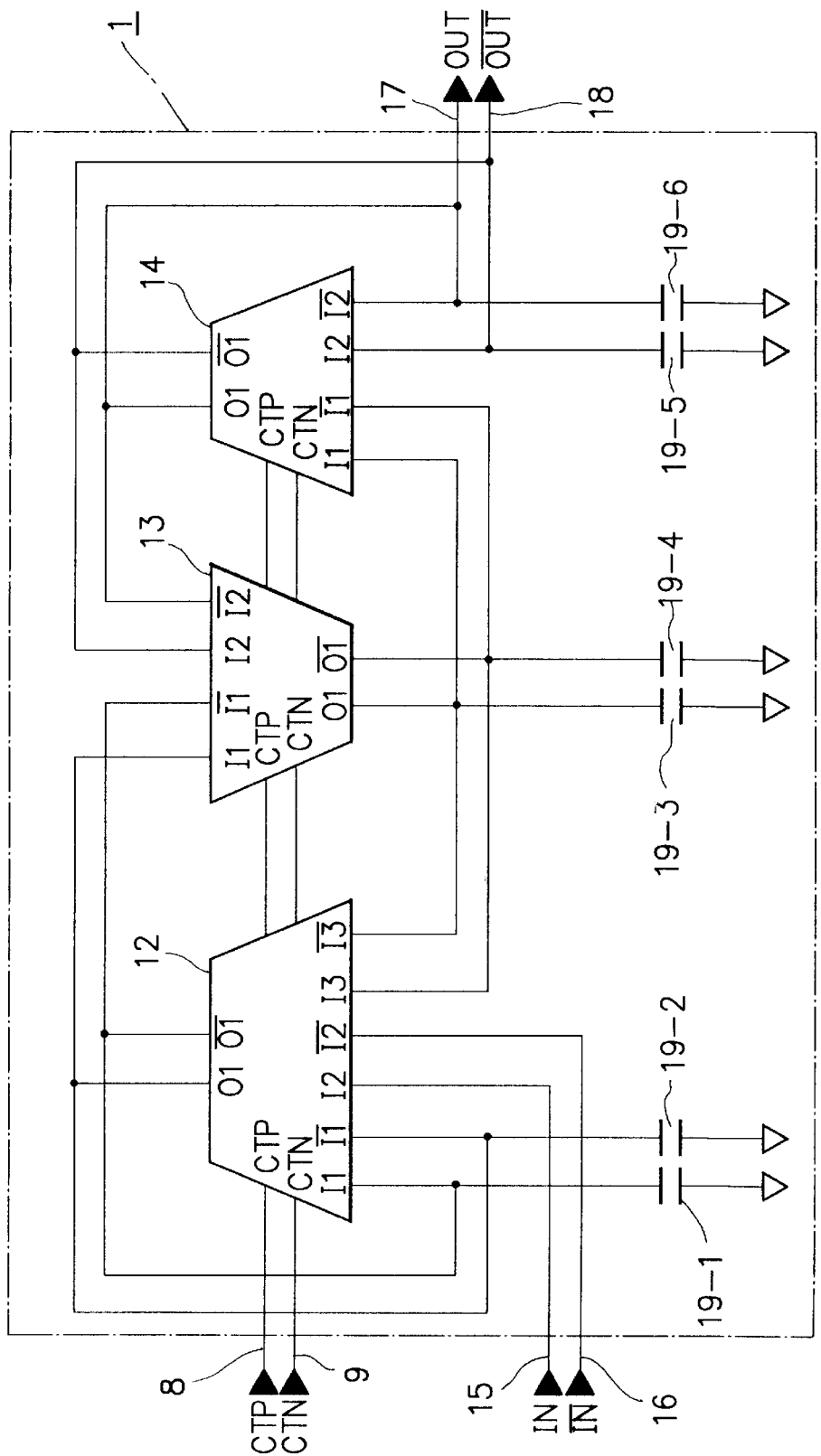
FIG. 9 is a circuit diagram showing another composition of a lowpass OTA-C filter with differential input and differential output in FIG. 7.

FIG. 9 is a circuit diagram showing another composition of a lowpass OTA-C filter with differential input and differential output, utilized as the OTA-C filters 1 and 2, which is derived from doubly resistively terminated LC filter circuit. In FIG. 9, the same reference characters as those of FIG. 7 or FIG. 8 designate equivalent components.

In FIG. 9, the lowpass OTA-C filter 1 includes an OTA 12 which receives three pairs of differential input signals and outputs a pair of differential output signals, OTAs 13 and 14 each of which receives two pairs of differential input signals and outputs a pair of differential output signals, and six capacitors 19-1 through 19-6 having capacitance value corresponding to the cutoff frequency of the filter 1. In other words, the OTA 12 has six input terminals, i.e. an input terminal I1, an input terminal I1 which is complementary to the input terminal I1, an input terminal I2, an input terminal I2 which is complementary to the input terminal I2, an input terminal I3, and an input terminal I3 which is complementary to the input terminal I3, and the OTA 12 has two output terminals, i.e. an output terminal O1 and an output terminal O1 which is complementary to the output terminal O1. Each of the OTA 13 and the OTA 14 has four input terminals, i.e. an input terminal I1, an input terminal I1 which is complementary to the input terminal I1, an input terminal I2, an input terminal I2 which is complementary to the input terminal I2, and Each of the OTA 13 and the OTA 14 has two output terminals, i.e. an output terminal O1 and an output terminal O1 which is complementary to the output terminal O1.

The capacitor 19-1 is connected between the output terminal O1 of the OTA 12 and the ground, the capacitor 19-2 is connected between the output terminal O1 of the OTA 12 and the ground, the capacitor 19-3 is connected between the output terminal O1 of the OTA 13 and the ground, the capacitor 19-4 is connected between the output terminal O1 of the OTA 13 and the ground, the capacitor 19-5 is connected between the output terminal O1 of the OTA 14 and the ground, and the capacitor 19-6 is connected between the output terminal O1 of the OTA 14 and the ground.

The filter 1 receives an input signal IN I5 and an input signal IN 16, and outputs an output signal OUT 17 and an output signal OUT 18. The input signal IN 15 is inputted into the input terminal I2 of the OTA 12, and the input signal IN 16 is inputted into the input terminal I2 of the OTA 12. And the output signal OUT 17 is outputted from the output terminal O1 of the OTA 14, and the output signal OUT 18 is outputted from the output terminal O1 of the OTA 14. A gate voltage control signal CTN 9 for internal nMOSFETs and a gate voltage control signal CTP 8 for internal pMOSFETs are supplied to each of the OTAs 12–14.

Figure 10A:
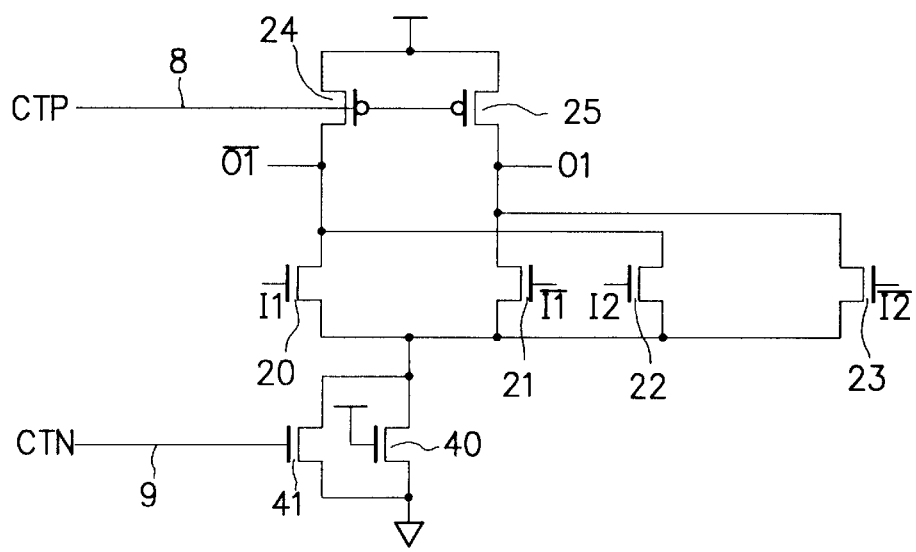
FIG. 10A is a circuit diagram showing composition of an OTA circuit with two pairs of differential input terminals and a pair of output terminals in FIG. 8 and FIG. 9.
Figure 10B:
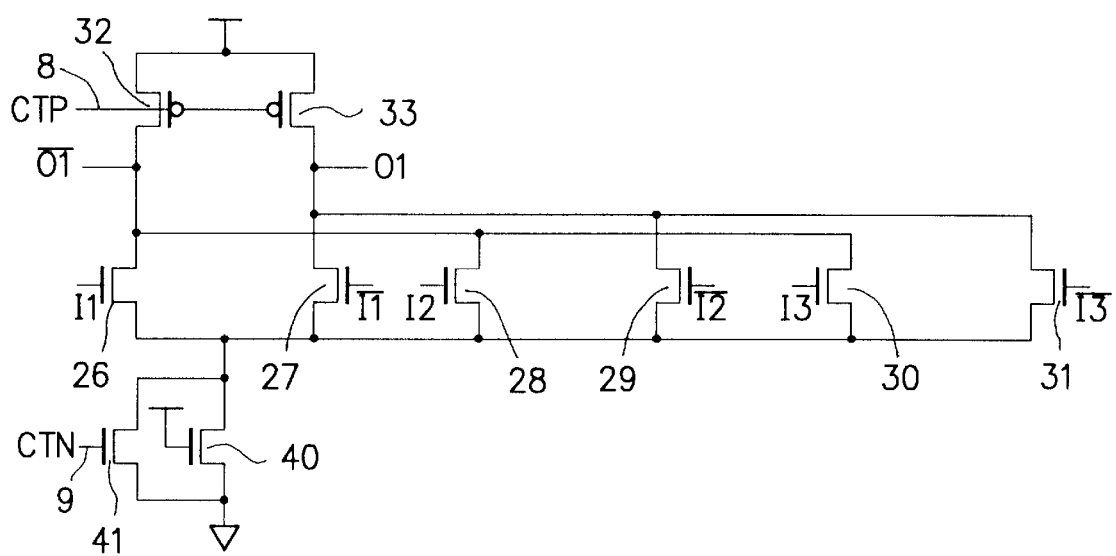
FIG. 10B is a circuit diagram showing composition of an OTA circuit with three pairs of differential input terminals and a pair of output terminal in FIG. 8 and FIG. 9.

FIG. 10A and FIG. 10B are circuit diagrams showing examples of internal composition of OTAs shown in FIG. 8 and FIG. 9. In FIG. 10A and FIG. 10B, the same reference characters as those of FIG. 7, FIG. 8, or FIG. 9 designate equivalent components. FIG. 10A shows an OTA having two pairs of differential input terminals and FIG. 10B shows an OTA having three pairs of differential input terminals.

The OTA shown in FIG. 10A includes a pMOSFET 24 and a pMOSFET 25 whose gates are supplied with the gate voltage control signal CTP 8 and whose sources are supplied with the power source voltage, a nMOSFET 41 whose gate is supplied with the gate voltage control signal CTN 9 and whose source is grounded, a nMOSFET 40 whose gate is supplied with the power source voltage and whose source is grounded and whose drain is connected with the drain of the nMOSFET 41, a nMOSFET 20 whose gate is connected to the input terminal I1 and whose source is connected with the drains of the nMOSFET 40 and 41 and whose drain is connected with the drain of the pMOSFET 24, a nMOSFET 21 whose gate is connected to the complementary input terminal I1 and whose source is connected with the drains of the nMOSFET 40 and 41 and whose drain is connected with the drain of the pMOSFET 25, a nMOSFET 22 whose gate is connected to the input terminal I2 and whose source is connected with the drains of the nMOSFET 40 and 41 and whose drain is connected with the drain of the pMOSFET 24, a nMOSFET 23 whose gate is connected to the complementary input terminal I2 and whose source is connected with the drains of the nMOSFET 40 and 41 and whose drain is connected with the drain of the pMOSFET 25.

The drains of pMOSFET 24, nMOSFET 20 and nMOSFET 22 are connected to the output terminal O1 , and the drains of pMOSFET 25, nMOSFET 21 and nMOSFET 23 are connected to the output terminal O1.

The OTA shown in FIG. 10B includes a pMOSFET 32 and a pMOSFET 33 whose gates are supplied with the gate voltage control signal CTP 8 and whose sources are supplied with the power source voltage, a nMOSFET 41 whose gate is supplied with the gate voltage control signal CTN 9 and whose source is grounded, a nMOSFET 40 whose gate is supplied with the power source voltage and whose source is grounded and whose drain is connected with the drain of the nMOSFET 41, a nMOSFET 26 whose gate is connected to the input terminal I1 and whose source is connected with the drains of the nMOSFET 40 and 41 and whose drain is connected with the drain of the pMOSFET 32, a nMOSFET 27 whose gate is connected to the complementary input terminal I1 and whose source is connected with the drains of the nMOSFET 40 and 41 and whose drain is connected with the drain of the pMOSFET 33, a nMOSFET 28 whose gate is connected to the input terminal I2 and whose source is connected with the drains of the nMOSFET 40 and 41 and whose drain is connected with the drain of the pMOSFET 32, a nMOSFET 29 whose gate is connected to the complementary input terminal I2 and whose source is connected with the drains of the nMOSFET 40 and 41 and whose drain is connected with the drain of the pMOSFET 33, a nMOSFET 30 whose gate is connected to the input terminal I3 and whose source is connected with the drains of the nMOSFET 40 and 41 and whose drain is connected with the drain of the pMOSFET 32, a nMOSFET 31 whose gate is connected to the complementary input terminal I3 and whose source is connected with the drains of the nMOSFET 40 and 41 and whose drain is connected with the drain of the pMOSFET 33.

The drains of pMOSFET 32 and nMOSFET 26, 28 and 30 are connected to the output terminal O1 , and the drains of pMOSFET 33 and nMOSFET 27, 29 and 31 are connected to the output terminal O1.

The OTA-C filters I and 2 shown in FIG. 8 or FIG. 9 are lowpass filters with differential input and differential output, which are derived from doubly resistively terminated LC filter circuits such as filter circuits shown in FIG. 1, FIG. 2, FIG. 4, or FIG. 5. In the aforementioned equation (1), if $V_o$ and $R_1 I_L$ are multiplied by k and $I_L$ is expressed as following equation (4), $$I_L = (V_1 \_k\, V_o - k\, R_1 I_L)/s\, L \quad (4)$$

the transfer function of the filter is expressed by following equation (5).

$$H(s) = 1/\{L\, C\, s^2 + (k\, R_1 C + L/R_2)s + k\, (1 + R_1/R_2)\} \quad (5)$$

FIG. 11 is a graph showing frequency characteristics of filters having transfer functions expressed by the equation (5), in cases where k=0.2 and 1. The gain of the filters are flat and constant below approximately 1 GHz and rapidly fall thereafter, i.e. the filters have lowpass characteristics. And as shown in the case where k=0.2, positive gain is obtained below approximately 1 GHz.

Here, setting k so that k<1 corresponds to setting gate widths of 'reversed input terminals' narrower than gate widths of 'unreversed input terminals' in OTAs used in the OTA-C filters 1 and 2. Here, a 'reversed input terminal' of an OTA means an input terminal to which a signal outputted from the OTA itself or a signal outputted from another OTA is inputted 'reversed'. For example, in the case of FIG. 9, the input terminal I1 of the OTA 12 is supplied with a signal outputted from the output terminal O1 of the OTA 12 itself (i.e. inverted output terminal→non-inverted input terminal), and the input terminal I1 of the OTA 12 is supplied with a signal outputted from the output terminal O1 of the OTA 12 itself (i.e. non-inverted output terminal→inverted input terminal), that is, the input terminals I1 and I1 of the OTA 12 are 'reversed input terminals'. The input terminal I3 of the OTA 12 is supplied with a signal outputted from the output terminal O1 of the OTA 13, and the input terminal I1 of the OTA 12 is supplied with a signal outputted from the output terminal O1 of the OTA 13, that is , the input terminals I3 and I3 of the OTA 12 are also 'reversed input terminals'. On the other hand, the input terminal I1 of the OTA 13 is supplied with a signal outputted from the output terminal O1 of the OTA 12 (i.e. non-inverted output terminal→non-inverted input terminal), and the input terminal I1 of the OTA 13 is supplied with a signal outputted from the output terminal O1 of the OTA 12 (i.e. inverted output terminal→inverted input terminal), that is, the input terminals I1 and I1 of the OTA 13 are 'unreversed input terminals'. Thus, in FIG. 9, input terminals I1, I1 , I3 and I3 of the OTA 12, input terminals I2 and I2 of the OTA 13, and input terminals I2 and I2 of the OTA 14 are 'reversed input terminals'. Therefore, in order to set the value k so that k >1, for the OTA 12, gate widths of the nMOSFETs 26, 27, 30 and 31 in FIG. 10B are set narrower than other gates. Similarly, for the OTA 13 and the OTA 14, gate widths of the nMOSFETs 22 and 23 in FIG. 10A are set narrower than other gates.

FIG. 12 is a graph showing a frequency characteristic of the OTA-C filter 1 (or 2) whose gate widths are set according to the aforementioned method. The gain of the OTA-C filter 1 is flat and constant below approximately 1 GHz and rapidly falls thereafter, showing lowpass characteristic. And as shown in FIG. 12, positive gain can be obtained below approximately 1 GHz. Therefore, the OTA-C filters 1 and 2 are usable for oscillators.

FIG. 13 is a graph showing output of the voltage controlled oscillator circuit shown in FIG. 7. First, the RESET signal is in High level, and thus the output signal O1 and the output signal O1 of the OTA-C filter 1 are set in High level and Low level respectively. Subsequently, when the RESET signal is switched to Low level at the time of 2 ns, the voltage controlled oscillator circuit starts oscillating, and the output signal O2 10 and the complementary output signal O2 11 vary as shown in FIG. 13.

Figure 14:
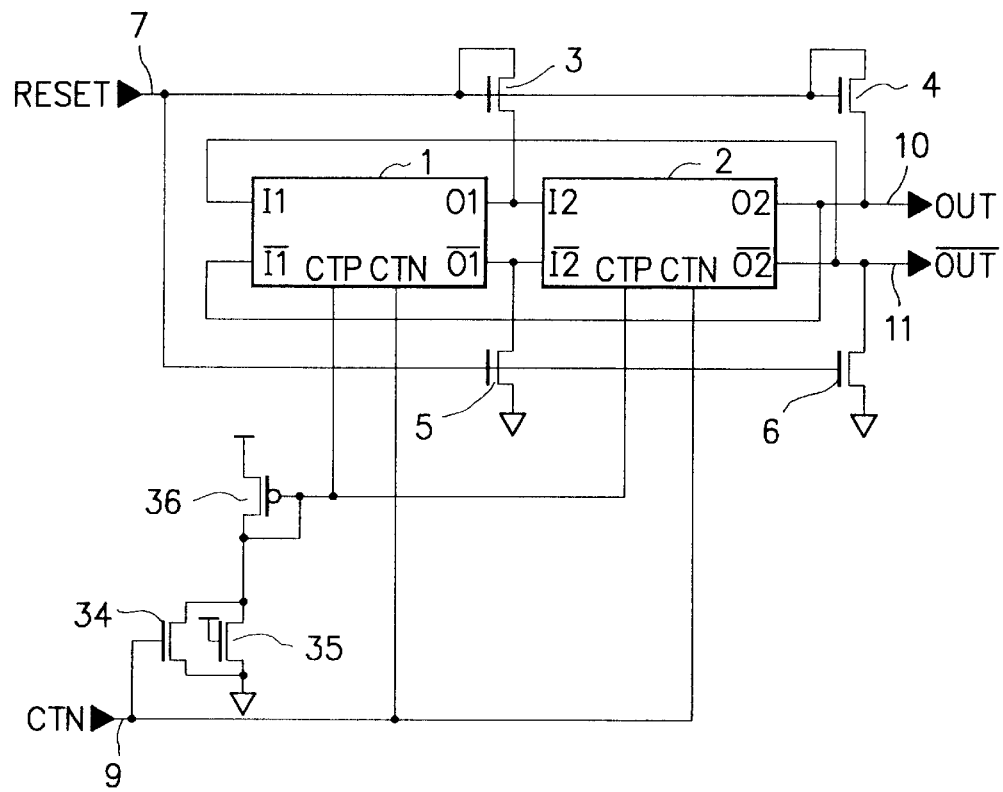
FIG. 14 is a circuit diagram showing another embodiment of the present invention further comprising a circuit for maintaining constant oscillation amplitude.

FIG. 14 is a circuit diagram showing the second embodiment of the present invention. The voltage controlled oscillator circuit in FIG. 14 further comprises a nMOSFET 34, a nMOSFET 35, and a pMOSFET 36, for controlling oscillation amplitude. In FIG. 14, current passing through the nMOSFET 34 and the nMOSFET 35 is controlled by the gate voltage control signal CTN 9. And gate voltage of the pMOSFET 36 is decided by the current passing through the nMOSFET 34.

The gate voltage of the pMOSFET 36 serves as control voltage of the pMOSFETs 24, 25, 32 and 33 in OTAs shown in FIG. 10A and FIG. 10B. Therefore, currents in the pMOSFETs 24, 25, 32 and 33 are adjusted according to the current passing through the nMOSFET 34. Therefore, according to the second embodiment, output oscillation amplitude can be maintained at a constant value independently of oscillation frequency.

Figure 15:
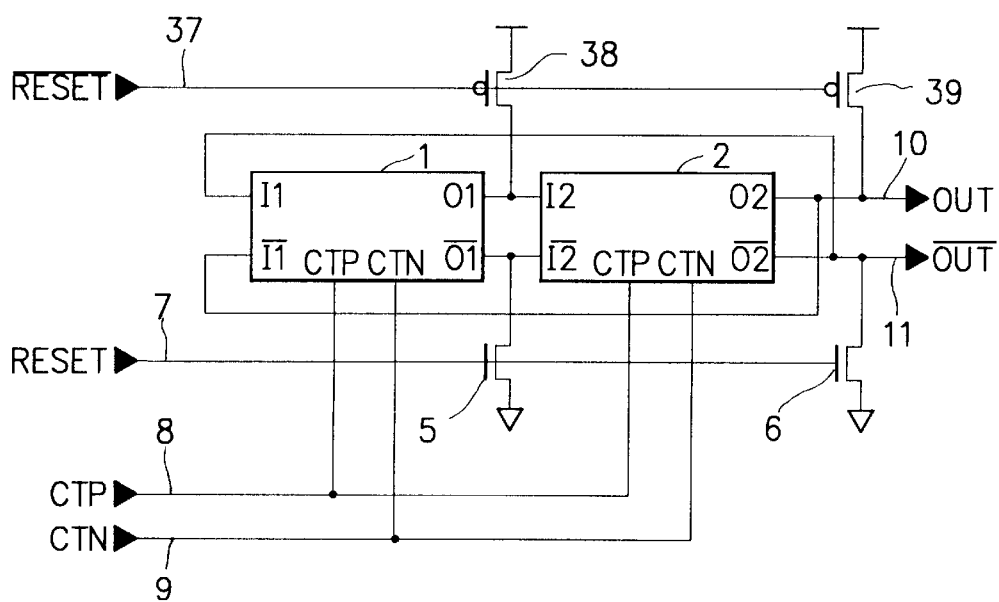
FIG. 15 is a circuit diagram showing another embodiment of the present invention.

FIG. 15 is a circuit diagram showing the third embodiment of the present invention. In FIG. 15, the nMOSFETs 3 and 4 in FIG. 7 are replaced by pMOSFETs 38 and 39. Gates of the pMOSFETs 38 and 39 are supplied with a RESET signal which is logical complementary to the RESET signal. It is obvious that aforementioned oscillation can be obtained by the composition of FIG. 15.

Figure 16A:
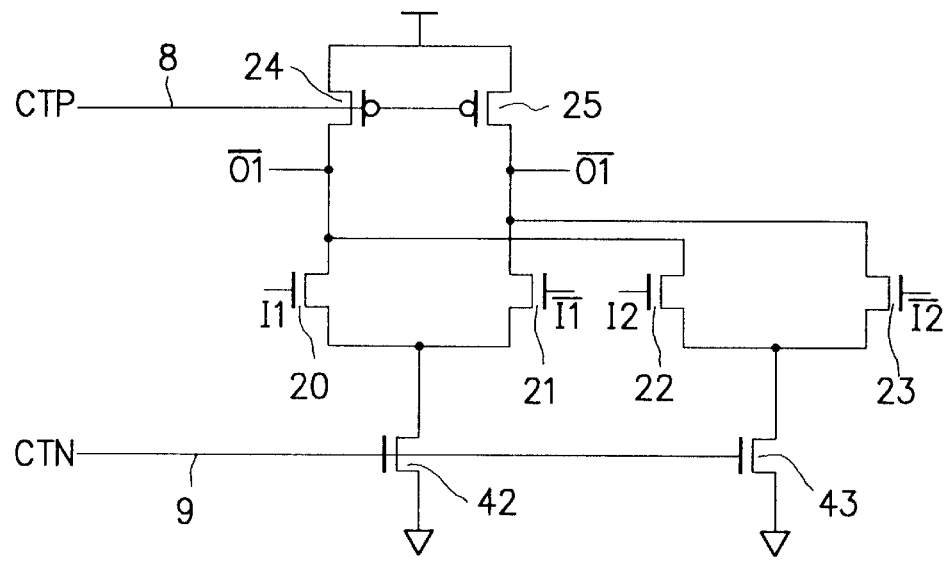
FIG. 16A is a circuit diagram showing another example of composition of an OTA circuit with two pairs of differential input terminals and a pair of output terminals.
Figure 16B:
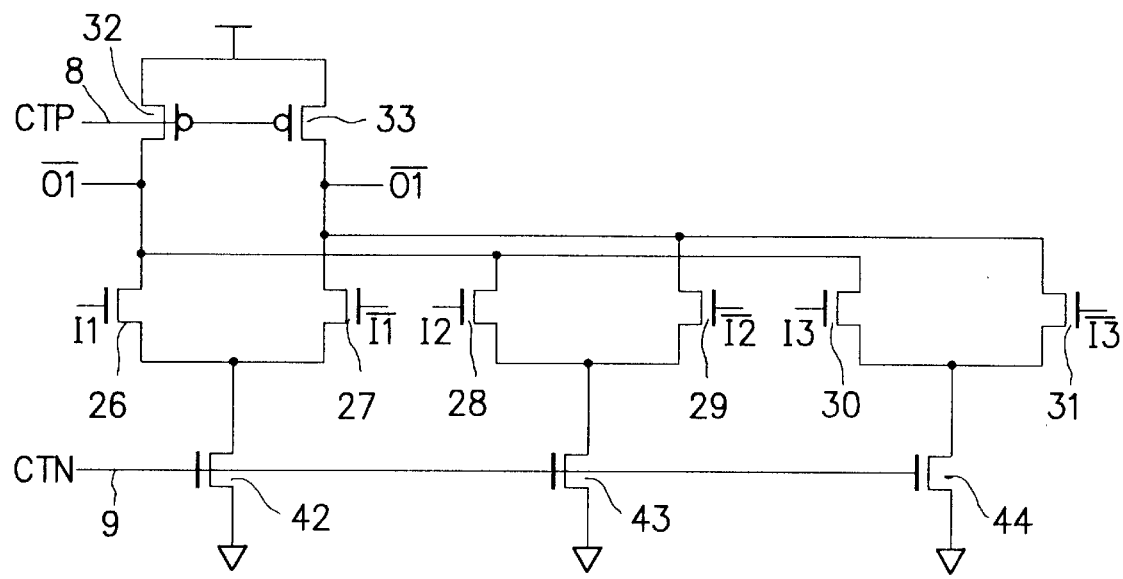
FIG. 16B is a circuit diagram showing another example of composition of an OTA circuit with three pairs of differential input terminals and a pair of output terminals.

FIG. 16A and FIG. 16B are circuit diagrams showing other examples of composition of OTAs used in OTA-C filters of the voltage controlled oscillator circuit. An equivalent voltage controlled oscillator circuit can be realized using the OTAs shown in FIG. 16A and FIG. 16B instead of the OTAs shown in FIG. 10A and FIG. 10B.

In FIG. 16A, the nMOSFETs 40 and 41 in FIG. 10A are replaced by nMOSFETs 42 and 43. And in FIG. 16B, the nMOSFET 40 and 41 in FIG. 10B are replaced by nMOSFETs 42, 43 and 44. It is obvious that aforementioned oscillation can be obtained by use of the OTAs of FIG. 16A and FIG. 16B.

Incidentally, although aforementioned voltage controlled oscillator circuit comprised two OTA-C filters, it is obvious that equivalent voltage controlled oscillator circuit can be constructed using more than three OTA-C filters. In other words, the voltage controlled oscillator circuit according to the present invention comprises N (N:2,3, ..) sets of OTA-C filters each of which including a non-inverted input terminal, an inverted input terminal complementary to the non-inverted input terminal, a non-inverted output terminal, and an inverted output terminal complementary to the non-inverted output terminal. And for each M (M:1, ··N−1), the non-inverted output terminal of the M-th OTA-C filter is connected with the non-inverted input terminal of the (M+1)-th OTA-C filter, the inverted output terminal of the M-th OTA-C filter is connected with the inverted input terminal of the (M+1)-th OTA-C filter. The non-inverted output terminal of the N-th OTA-C filter is connected with the inverted input terminal of the first OTA-C filter, and the inverted output terminal of the N-th OTA-C filter is connected with the non-inverted input terminal of the first OTA-C filter. In each OTA in the OTA-C filters, gate widths of 'reversed input terminals' are set narrower than gate widths of 'uunreversed input terminals'. And the voltage controlled oscillator circuit further comprises a level setting means for setting the non-inverted output terminals of the N sets of OTA-C filters in a first voltage level and setting the inverted output terminals of the N sets of OTA-C filters in a second voltage level which is logical inversion of the first voltage level. Consequently, oscillation output of the voltage controlled oscillator circuit is outputted from the non-inverted output terminal and the inverted output terminal of the N-th OTA-C filter.

As set forth hereinabove, in the voltage controlled oscillator circuit according to the present invention, by using a plurality of lowpass OTA-C filters with differential input and differential output, each of which is derived from a doubly resistively terminated LC filter circuit, and by setting appropriate gate widths of input terminals of OTAs, and by setting the initial values by the MOSFETs for causing oscillation, oscillation of a waveform of a sine wave can be obtained, switching noise can be reduced, and common mode noise can be removed by differential operation. Further, susceptibility to outside noise from power sources, circuit boards, etc. can be reduced, since sensitivity is reduced by utilizing OTA-C filters derived from doubly resistively terminated LC filters. And consequently, oscillation output including little phase noise is obtained by the voltage controlled oscillator circuit according to the present invention.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A voltage controlled oscillator circuit comprising N (N: 2,3,··) sets of OTA-C filters each of which including a non-inverted input terminal, an inverted input terminal complementary to the non-inverted input terminal, a non-inverted output terminal, and an inverted output terminal complementary to the non-inverted output terminal, and in each OTA in the OTA-C filters, gate widths of 'reversed input terminals' are set narrower than gate widths of 'unreversed input terminals', wherein, for each M (M: 1,··N−1), the non-inverted output terminal of the M-th OTA-C filter is connected with the non-inverted input terminal of the (M+1)-th OTA-C filter, the inverted output terminal of the M-th OTA-C filter is connected with the inverted input terminal of the (M+1)-th OTA-C filter, the non-inverted output terminal of the N-th OTA-C filter is connected with the inverted input terminal of the first OTA-C filter, the inverted output terminal of the N-th OTA-C filter is connected with the non-inverted input terminal of the first OTA-C filter, and oscillation output of the voltage controlled oscillator circuit is outputted from the non-inverted output terminal and the inverted output terminal of the N-th OTA-C filter.

2. A voltage controlled oscillator circuit as claimed in claim 1, wherein the OTA-C filter has composition equivalent to a doubly resistively terminated LC filter circuit.

3. A voltage controlled oscillator circuit as claimed in claim 1, wherein the OTA-C filter includes OTAs and capacitors having capacitance according to the cutoff frequency of the OTA-C filter.

4. A voltage controlled oscillator circuit as claimed in claim 1 further comprising a level setting means for setting the non-inverted output terminals of the N sets of OTA-C filters in a first voltage level and setting the inverted output terminals of the N sets of OTA-C filters in a second voltage level which is logical inversion of the first voltage level.

5. A voltage controlled oscillator circuit as claimed in claim 4, wherein the level setting means includes N sets of nMOSFETs each of which is supplied with an external signal to its gate and source and supplied with a non-inverted output of corresponding one of the N sets of OTA-C filters to its drain, and N sets of nMOSFETs each of which is supplied with the external signal to its gate and supplied with the ground level to its source and supplied with an inverted output of corresponding one of the N sets of OTA-C filters to its drain, in which the external signal is set so as to set the non-inverted output terminals of the N sets of OTA-C filters in the first voltage level and so as to set the inverted output terminals of the N sets of OTA-C filters in the second voltage level which is logical inversion of the first voltage level.

6. A voltage controlled oscillator circuit as claimed in claim 4, wherein the level setting means includes N sets of nMOSFETs each of which is supplied with an external signal to its gate and supplied with the ground level to its source and supplied with an inverted output of corresponding one of the N sets of OTA-C filters to its drain, and N sets of pMOSFETs each of which is supplied with an external signal which is complementary to the external signal to its gate and supplied with the power source voltage to its source and supplied with a non-inverted output of corresponding one of the N sets of OTA-C filters to its drain, in which the external signal is set so as to set the non-inverted output terminals of the N sets of OTA-C filters in the first voltage level and so as to set the inverted output terminals of the N sets of OTA-C filters in the second voltage level which is logical inversion of the first voltage level.

7. A voltage controlled oscillator circuit as claimed in claim 1, wherein each of the N sets of OTA-C filters includes:

a first OTA circuit which has a first input terminal, a first input terminal bar which is complementary to the first input terminal, a second input terminal, a second input terminal bar which is complementary to the second input terminal, a third input terminal, a third input terminal bar which is complementary to the third input terminal, a first output terminal, and a first output terminal bar which is complementary to the first output terminal;

a second OTA circuit which has a fourth input terminal, a fourth input terminal bar which is complementary to the fourth input terminal, a fifth input terminal, a fifth input terminal bar which is complementary to the fifth input terminal, a second output terminal, and a second output terminal bar which is complementary to the second output terminal;

a first capacitor which is connected between the first output terminal and the ground;

a second capacitor which is connected between the first output terminal bar and the ground;

a third capacitor which is connected between the second output terminal and the ground;

a fourth capacitor which is connected between the second output terminal bar and the ground;

in which:

the first input terminal is connected with the first output terminal bar and the first input terminal bar is connected with the first output terminal, the second input terminal is connected with the non-inverted input terminal of the OTA-C filter and the second input terminal bar is connected with the inverted input terminal of the OTA-C filter, the third input terminal is connected with the second output terminal bar and the third input terminal bar is connected with the second output terminal, the fourth input terminal is connected with the first output terminal and the fourth input terminal bar is connected with the first output terminal bar, the fifth input terminal is connected with the second output terminal bar and the fifth input terminal bar is connected with the second output terminal, and the second output terminal is connected with the non-inverted output terminal of the OTA-C filter and the second output terminal bar is connected with the inverted output terminal of the OTA-C filter.

8. A voltage controlled oscillator circuit as claimed in claim 1, wherein each of the N sets of OTA-C filters includes:

a first OTA circuit which has a first input terminal, a first input terminal bar which is complementary to the first input terminal, a second input terminal, a second input terminal bar which is complementary to the second input terminal, a third input terminal, a third input terminal bar which is complementary to the third input terminal, a first output terminal, and a first output terminal bar which is complementary to the first output terminal;

a second OTA circuit which has a fourth input terminal, a fourth input terminal bar which is complementary to the fourth input terminal, a fifth input terminal, a fifth input terminal bar which is complementary to the fifth input terminal, a second output terminal, and a second output terminal bar which is complementary to the second output terminal;

a third OTA circuit which has a sixth input terminal, a sixth input terminal bar which is complementary to the sixth input terminal, a seventh input terminal, a seventh input terminal bar which is complementary to the seventh input terminal, a third output terminal, and a third output terminal bar which is complementary to the third output terminal;

a first capacitor which is connected between the first output terminal and the ground;

a second capacitor which is connected between the first output terminal bar and the ground;

a third capacitor which is connected between the second output terminal and the ground;

a fourth capacitor which is connected between the second output terminal bar and the ground;

a fifth capacitor which is connected between the third output terminal and the ground; and a sixth capacitor which is connected between the third output terminal bar and the ground, in which:

the first input terminal is connected with the first output terminal bar and the first input terminal bar is connected with the first output terminal, the second input terminal is connected with the non-inverted input terminal of the OTA-C filter and the second input terminal bar is connected with the inverted input terminal of the OTA-C filter, the third input terminal is connected with the second output terminal bar and the third input terminal bar is connected with the second output terminal, the fourth input terminal is connected with the first output terminal and the fourth input terminal bar is connected with the first output terminal bar, the fifth input terminal is connected with the third output terminal bar and the fifth input terminal bar is connected with the third output terminal, the sixth input terminal is connected with the second output terminal and the sixth input terminal bar is connected with the second output terminal bar, the seventh input terminal is connected with the third output terminal bar and the seventh input terminal bar is connected with the third output terminal, and the third output terminal is connected with the non-inverted output terminal of the OTA-C filter and the third output terminal bar is connected with the inverted output terminal of the OTA-C filter.

9. A voltage controlled oscillator circuit as claimed in claim 3, wherein each OTA circuit includes:

a first pMOSFET whose gate is supplied with a first control signal and whose source is supplied with the power source voltage;

a second pMOSFET whose gate is supplied with the first control signal and whose source is supplied with the power source voltage;

a first nMOSFET whose gate is supplied with a second control signal and whose source is connected to the ground;

a second nMOSFET whose gate is supplied with the power source voltage and whose source is connected to the ground and whose drain is connected with the drain of the first nMOSFET;

a third nMOSFET whose gate is supplied with a first input signal and whose source is connected with the drain of the first nMOSFET and whose drain is connected with the drain of the first pMOSFET;

a fourth nMOSFET whose gate is supplied with a first input signal bar which is complementary to the first input signal and whose source is connected with the drain of the first nMOSFET and whose drain is connected with the drain of the second pMOSFET;

a fifth nMOSFET whose gate is supplied with a second input signal and whose source is connected with the drain of the first nMOSFET and whose drain is connected with the drain of the first pMOSFET; and a sixth nMOSFET whose gate is supplied with a second input signal bar which is complementary to the second input signal and whose source is connected with the drain of the first nMOSFET and whose drain is connected with the drain of the second pMOSFET.

10. A voltage controlled oscillator circuit as claimed in claim 9, further comprising:

a seventh nMOSFET whose gate is supplied with the second control signal and whose source is connected to the ground;

an eighth nMOSFET whose gate is supplied with the power source voltage and whose source is connected to the ground and whose drain is connected with the drain of the seventh nMOSFET; and a third pMOSFET whose gate and drain is connected with the drain of the seventh nMOSFET and whose source is supplied with the power source voltage, wherein the voltage level of the gate of the third pMOSFET is used as the first control signal.

11. A voltage controlled oscillator circuit as claimed in claim 3, wherein each OTA circuit includes:

a first pMOSFET whose gate is supplied with a first control signal and whose source is supplied with the power source voltage;

a second pMOSFET whose gate is supplied with the first control signal and whose source is supplied with the power source voltage;

a first nMOSFET whose gate is supplied with a second control signal and whose source is connected to the ground;

a second nMOSFET whose gate is supplied with the second control signal and whose source is connected to the ground;

a third nMOSFET whose gate is supplied with a first input signal and whose source is connected with the drain of the first nMOSFET and whose drain is connected with the drain of the first pMOSFET;

a fourth nMOSFET whose gate is supplied with a first input signal bar which is complementary to the first input signal and whose source is connected with the drain of the first nMOSFET and whose drain is connected with the drain of the second pMOSFET;

a fifth nMOSFET whose gate is supplied with a second input signal and whose source is connected with the drain of the second nMOSPET and whose drain is connected with the drain of the first pMOSFET; and a sixth nMOSFET whose gate is supplied with a second input signal bar which is complementary to the second input signal and whose source is connected with the drain of the second nMOSFET and whose drain is connected with the drain of the second pMOSFET.

12. A voltage controlled oscillator circuit comprising a first OTA-C filter and a second OTA-C filter, each of which including a non-inverted input terminal, an inverted input terminal complementary to the non-inverted input terminal, a non-inverted output terminal, and an inverted output terminal complementary to the non-inverted output terminal, and in each OTA in the OTA-C filters, gate widths of 'reversed input terminals' are set narrower than gate widths of 'unreversed input terminals', wherein the non-inverted output terminal of the first OTA-C filter is connected with the non-inverted input terminal of the second OTA-C filter, the inverted output terminal of the first OTA-C filter is connected with the inverted input terminal of the second OTA-C filter, the non-inverted output terminal of the second OTA-C filter is connected with the inverted input terminal of the first OTA-C filter, the inverted output terminal of the second OTA-C filter is connected with the non-inverted input terminal of the first OTA-C filter, and oscillation output of the voltage controlled oscillator circuit is outputted from the non-inverted output terminal and the inverted output terminal of the second OTA-C filter.

13. A voltage controlled oscillator circuit as claimed in claim 12, further comprising a level setting means for setting the non-inverted output terminals of the first and the second OTA-C filters in a first voltage level and setting the inverted output terminals of the first and the second OTA-C filters in a second voltage level which is logical inversion of the first voltage level.

14. A voltage controlled oscillator circuit as claimed in claim 13, wherein the level setting means includes a first nMOSFET which is supplied with an external signal to its gate and source and supplied with the non-inverted output of the first OTA-C filter to its drain, a second nMOSFET which is supplied with the external signal to its gate and source and supplied with the non-inverted output of the second OTA-C filter to its drain, a third nMOSFET which is supplied with the external signal to its gate and supplied with the ground level to its source and supplied with the inverted output of the first OTA-C filter to its drain, a fourth nMOSFET which is supplied with the external signal to its gate and supplied with the ground level to its source and supplied with the inverted output of the second OTA-C filter to its drain, in which the external signal is set so as to set the non-inverted output terminals of the first and the second OTA-C filters in the first voltage level and so as to set the inverted output terminals of the first and the second OTA-C filters in the second voltage level which is logical inversion of the first voltage level.

15. A voltage controlled oscillator circuit as claimed in claim 12, wherein each of the first and the second OTA-C filter includes OTAs and capacitors having capacitance according to the cutoff frequency of the OTA-C filter.

* * * * *